United States Patent
Takahara et al.

(10) Patent No.: US 10,351,728 B2
(45) Date of Patent: Jul. 16, 2019

(54) THERMOSETTING RESIN COMPOSITION, METHOD OF PRODUCING THERMAL CONDUCTIVE SHEET, AND POWER MODULE

(71) Applicant: MITSUBISHI ELECTRIC CORPORATION, Chiyoda-ku (JP)

(72) Inventors: Mariko Takahara, Chiyoda-ku (JP); Kenji Mimura, Chiyoda-ku (JP); Yurie Nakamura, Chiyoda-ku (JP); Motoki Masaki, Chiyoda-ku (JP)

(73) Assignee: MITSUBISHI ELECTRIC CORPORATION, Chiyoda-ku (JP)

( * ) Notice: Subject to any disclaimer, the term of this patent is extended or adjusted under 35 U.S.C. 154(b) by 179 days.

(21) Appl. No.: 14/896,235

(22) PCT Filed: Jan. 10, 2014

(86) PCT No.: PCT/JP2014/050321
§ 371 (c)(1),
(2) Date: Dec. 4, 2015

(87) PCT Pub. No.: WO2014/199650
PCT Pub. Date: Dec. 18, 2014

(65) Prior Publication Data
US 2016/0115343 A1   Apr. 28, 2016

(30) Foreign Application Priority Data
Jun. 14, 2013 (JP) ................. 2013-125480

(51) Int. Cl.
| | | |
|---|---|---|
| *C08K 3/38* | (2006.01) | |
| *B29C 41/00* | (2006.01) | |
| *B29C 41/02* | (2006.01) | |
| *B29L 31/34* | (2006.01) | |
| *H01L 21/48* | (2006.01) | |
| *H01L 23/00* | (2006.01) | |
| *H01L 23/36* | (2006.01) | |
| *B29K 101/10* | (2006.01) | |
| *B29K 105/16* | (2006.01) | |
| *B29K 509/04* | (2006.01) | |
| *C01B 21/064* | (2006.01) | |
| *C08L 101/00* | (2006.01) | |
| *C09D 163/00* | (2006.01) | |
| *H01L 23/373* | (2006.01) | |
| *H01L 23/433* | (2006.01) | |
| *H01L 23/495* | (2006.01) | |

(52) U.S. Cl.
CPC .......... *C09D 163/00* (2013.01); *B29C 41/003* (2013.01); *B29C 41/02* (2013.01); *C08K 3/38* (2013.01); *C08L 101/00* (2013.01); *H01L 21/4871* (2013.01); *H01L 23/36* (2013.01); *H01L 23/3737* (2013.01); *H01L 23/4334* (2013.01); *H01L 23/49575* (2013.01); *H01L 24/29* (2013.01); *B29K 2101/10* (2013.01); *B29K 2105/16* (2013.01); *B29K 2509/04* (2013.01); *B29K 2995/0013* (2013.01); *B29L 2031/34* (2013.01); *C01B 21/064* (2013.01); *C01B 21/0648* (2013.01); *C08K 2003/385* (2013.01); *C08K 2201/016* (2013.01); *H01L 2224/29499* (2013.01); *H01L 2224/32245* (2013.01)

(58) Field of Classification Search
CPC ........ C08K 2003/385; C08K 2201/016; C01B 21/064; C01B 21/0648
See application file for complete search history.

(56) References Cited

U.S. PATENT DOCUMENTS

2008/0153960 A1* 6/2008 Meneghetti ............ B82Y 30/00
524/404

FOREIGN PATENT DOCUMENTS

| | | |
|---|---|---|
| CN | 102770956 A | 11/2012 |
| JP | 2006 2076 | 1/2006 |
| JP | 2007308360 A * | 11/2007 |
| JP | 2009 144072 | 7/2009 |
| JP | 2009 280720 | 12/2009 |
| JP | 2010 260225 | 11/2010 |
| JP | 2011 6586 | 1/2011 |
| JP | 2011 225856 | 11/2011 |
| JP | 2012 224676 | 11/2012 |
| WO | 2013 081061 | 6/2013 |

OTHER PUBLICATIONS

Machine translated English language equivalent of JP 2007-308360 (Nov. 2007, 9 pages).*
Combined Chinese Office Action and Search Report dated Oct. 8, 2016 in Patent Application No. 201480033696.6 (with English language translation and English translation of categories of cited documents).
International Search Report dated Apr. 1, 2014 in PCT/JP2014/050321 Filed Jan. 10, 2014.

* cited by examiner

*Primary Examiner* — Brieann R Johnston
(74) *Attorney, Agent, or Firm* — Oblon, McClelland, Maier & Neustadt, L.L.P.

(57) ABSTRACT

A thermosetting resin composition containing a thermosetting resin and an inorganic filler, in which the inorganic filler contains secondary sintered particles (A) formed of primary particles of boron nitride, which have an aspect ratio of 10 to 20, and secondary sintered particles (B) formed of the primary particles of boron nitride, which have an aspect ratio of 2 to 9. The thermosetting resin composition can produce a thermal conductive sheet that has excellent filling property of the inorganic filler, and excellent thermal conductivity, adhesiveness and electrical insulating properties.

11 Claims, 3 Drawing Sheets

THERMOSETTING RESIN COMPOSITION, METHOD OF PRODUCING THERMAL CONDUCTIVE SHEET, AND POWER MODULE

TECHNICAL FIELD

The present invention relates to a thermosetting resin composition, a method of producing a thermal conductive sheet, and a power module, in particular, to a thermosetting resin composition that is used to produce a thermal conductive sheet that transmits heat from a heat generation member of an electrical/electronic apparatus to a heat dissipation member, a method of producing the thermal conductive sheet that uses the thermosetting resin composition and a power module.

BACKGROUND ART

A member that transmits heat generated from a heat generation portion of an electrical/electronic apparatus to a heat dissipation member must have excellent thermal conductivity and electrical insulating properties. As a member that satisfies such requirements, a thermal conductive sheet in which an inorganic filler is dispersed in a cured material of a thermosetting resin is in wide use. As the inorganic filler that is used in the thermal conductive sheet, alumina, boron nitride, silica, aluminum nitride and the like can be used. Among these, boron nitride is suitably used in the thermal conductive sheet because it has excellent chemical stability in addition to thermal conductivity and electrical insulating properties, and further is harmless and relatively cheap.

Boron nitride has the same molecular structure as that of graphite. Further, generally commercialized boron nitride has a scaly crystal structure as shown in FIG. 5. Boron nitride has a thermal anisotropy such that the thermal conductivity is high in an a-axis direction (face direction) and low in a c-axis direction (thickness direction), and the thermal conductivity in an a-axis direction of the crystal is said to be several to several tens of times that in a c-axis direction. Further, crystal growth of boron nitride is more preferential in the a-axis direction than in the c-axis direction, and the shape of a primary particle is broad in a (002) face parallel to the a-axis direction and narrow in a (100) face parallel to the c-axis direction. Therefore, the (002) face is called a stacking face and the (100) face is called an edge-face. Further, as obvious from the molecular structure of boron nitride shown in FIG. 6, there are functional groups such as hydroxyl groups, amino groups and the like on a face of a particle of boron nitride, and these mainly form covalent bonds with boron atoms on the edge-face of boron nitride. Thus, boron nitride has a feature that its affinity with organic solvents and resins becomes high due to the presence of these functional groups.

Further, since the thermal conductivities of the inorganic fillers such as boron nitride and the like are larger than that of the resin, in order to improve the thermal conductivity of the thermal conductive sheets, thermal conductive sheets in which the content of the inorganic filler is increased have been developed.

For example, Patent Document 1 proposes a thermal conductive sheet of which thermal conductivity is improved by incorporating 60% by volume or more in total of a spherical filler of which the average particle size is specified and a non-spherical filler of which the average length and aspect ratio are specified.

Further, Patent Document 2 proposes a thermal conductive sheet of which thermal conductivity and electrical insulating properties are simultaneously improved by combining two kinds of secondary particles of boron nitride which are different in cohesive strength as the inorganic filler, and by setting the content of the inorganic filler to 40% by volume to 80% by volume.

REFERENCE

Patent Documents

[Patent Document 1] JP 2009-144072 A
[Patent Document 2] JP 2011-6586 A

DISCLOSURE OF THE INVENTION

Problems to be Solved by the Invention

However, boron nitride is a substance with low adhesive properties, as obvious from its general use as a lubricant. Therefore, conventional thermal conductive sheets that use boron nitride as the inorganic filler have a problem in that the adhesiveness between boron nitride and the resin is low. In particular, when the content of boron nitride is increased to improve the thermal conductivity of a thermal conductive sheet as in Patent Documents 1 and 2, the adhesiveness decreases drastically because the content of the resin providing the adhesiveness decreases. As a result, the adhesiveness between a thermal conductive sheet and other members (for example, heat generation members, heat dissipation members and the like) also decreases, and the electrical insulating properties of the electrical/electronic apparatuses in which the thermal conductive sheet is incorporated are impaired.

The present invention has been developed to solve the above described problems and is aimed at providing a thermosetting resin composition that provides a thermal conductive sheet having excellent filling properties of the inorganic filler and excellent thermal conductivity, adhesiveness and electrical insulating properties.

Further, the present invention is aimed at providing a method of producing a thermal conductive sheet having excellent filling properties of the inorganic filler and excellent thermal conductivity, adhesiveness and electrical insulating properties.

Still further, the present invention is aimed at providing a power module having excellent heat dissipation properties and electrical insulating properties.

Means for Solving the Problems

As a result of earnest study to solve the above described problems, the present inventors found that the thermal conductivity, the adhesiveness and the electrical insulating properties of a thermal conductive sheet can all be improved simultaneously by blending two kinds of secondary particles formed of primary particles having different aspect ratios as an inorganic filler by paying attention to the close relationship between the aspect ratio of the primary particles of boron nitride, which constitute the secondary particles of boron nitride, and the thermal conductivity and adhesiveness of the thermal conductive sheet in a thermosetting resin composition that contains the secondary particles of boron nitride as the inorganic filler.

That is, the present invention relates to a thermosetting resin composition that contains a thermosetting resin and an inorganic filler, in which the inorganic filler contains secondary particles (A) formed of primary particles of boron nitride having an aspect ratio of 10 to 20, and secondary particles (B) formed of primary particles of boron nitride having an aspect ratio of 2 to 9.

Further, the present invention relates to a method of producing the thermal conductive sheet which includes a step of coating and drying the thermosetting resin composition on a mold-releasing base material, and a step of curing a coated and dried material while pressurizing under a pressing pressure of 0.5 MPa to 50 MPa.

Further, the present invention relates to a power module that is provided with a power semiconductor element mounted on one heat dissipation member, another heat dissipation member that externally dissipates heat generated by the power semiconductor element, and the thermal conductive sheet that is produced according to the method of producing the thermal conductive sheet and transmits heat generated by the semiconductor element from the one heat dissipation member to the other heat dissipation member.

Effects of the Invention

According to the present invention, a thermosetting resin composition that provides the thermal conductive sheet having excellent filling properties of the inorganic filler and excellent thermal conductivity, adhesiveness and electrical insulating properties can be provided.

Further, according to the present invention, a method of producing the thermal conductive sheet that has excellent filling properties of the inorganic filler and excellent thermal conductivity, adhesiveness and electrical insulating properties can be provided.

Still further, according to the present invention, a power module having excellent heat dissipation properties and electrical insulating properties can be provided.

BEST MODE FOR CARRYING OUT THE INVENTION

Embodiment 1

A thermosetting resin composition of the present embodiment includes a thermosetting resin and an inorganic filler.

The inorganic filler includes two kinds of secondary particles (A) and (B) formed of primary particles of boron nitride. Here, "secondary particle" in the present specification means what is obtained by binding primary particles of boron nitride with each other by isotropically flocculating and sintering the primary particles of boron nitride. The secondary particles have isotropic thermal conductivity because the primary particles are flocculated in all directions. The specific surface areas and the compressive strengths of the secondary particles (A) and (B) can be controlled by adjusting the aspect ratio and sintering conditions of the primary particles of boron nitride used as a raw material when producing the secondary particles.

The secondary particles (A) and (B) have different aspect ratios as the primary particles of boron nitride which are used as a raw material have different aspect ratios. The aspect ratio of the primary particles of boron nitride which constitute the secondary particle (A) is larger than the aspect ratio of the primary particles of boron nitride which constitute the secondary particle (B).

Here, in the present specification, the aspect ratio of the primary particles of boron nitride which constitute the secondary particle means a value obtained by preparing a sample in which the secondary particles are buried in an epoxy resin, polishing a cross-section of the sample, taking several micrographs enlarged several thousand times by an electron microscope, measuring major diameters and minor diameters of any 100 primary particles that constitute the secondary particle, calculating ratios of the major diameter and the minor diameter (major diameter/minor diameter) and, obtaining an average value.

Figure 1:
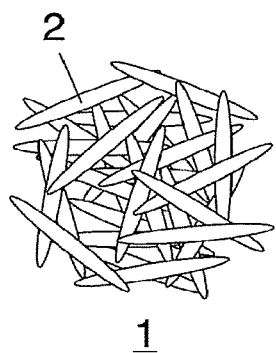
FIG. 1 is a schematic sectional view of a secondary particle (A).

A schematic cross-sectional view of the secondary particle (A) is shown in FIG. 1. As shown in FIG. 1, the secondary particle (A) 1 is formed of the primary particles 2 of boron nitride, which have a large aspect ratio. Specifically, the secondary particle (A) 1 is formed of the primary particles 2 of boron nitride which have an aspect ratio of 10 to 20, preferably 10.2 to 18, more preferably 10.3 to 16. The primary particles 2 of boron nitride having such an aspect ratio can efficiently transmit heat because the diameter in the a-axis direction (face direction) having high thermal conductivity is larger than the diameter in the c-axis direction (thickness direction) having low thermal conductivity. Therefore, the secondary particle (A) 1 mainly works as a component that improves the thermal conductivity of the thermal conductive sheet. When the aspect ratio of the primary particle 2 of boron nitride is less than 10, a thermal conductive sheet having the desired thermal conductivity cannot be obtained because the diameter in the c-axis direction (thickness direction) that is low in thermal conductivity becomes larger. On the other hand, when the aspect ratio of the primary particle 2 of boron nitride exceeds 20, the secondary particle (A) 1 collapses during production of the thermal conductive sheet (for example, during the step of pressing) and a thermal conductive sheet having the desired thermal conductivity cannot be obtained because it is difficult to form the secondary particle (A) 1 and the cohesive strength of the secondary particle (A) 1 decreases.

The shape of the secondary particle (A) 1 is not particularly limited and can be spherical, as well as oblong, flaky, or the like. In particular, the secondary particle (A) 1 is preferably spherical because when the secondary particle (A) 1 is spherical, the blending amount of the secondary particles (A) 1 can be increased while securing the fluidity of the thermosetting resin composition at the time of producing the thermosetting resin composition.

An average particle size of the secondary particles (A) 1 is not particularly limited but is preferably 20 μm to 110 μm, and more preferably 40 μm to 80 μm. When the average particle size of the secondary particles (A) 1 is less than 20 μm, the interfacial thermal resistance of the secondary particles (A) 1 increases and the thermal conductivity may decrease. When secondary particles (A) 1 having an average particle size in the above range are used, the effect of the present invention can be acquired stably.

Here, when an average particle size of the secondary particles in the thermosetting resin composition is measured, the average particle size can be obtained by carrying out a particle size distribution measurement of a sample according to a laser diffraction/scattering method with secondary particles of a raw material as the sample. Further, when the average particle size of the secondary particles in the thermal conductive sheet is measured with the secondary particles obtained by calcifying the thermal conductive sheet by heat treating at a temperature from 500° C. to 800° C. for about 5 to 10 hours in an air atmosphere using an electric furnace as a sample, the average particle size of the sample can be obtained by carrying out a particle size distribution measurement according to a laser diffraction/scattering method.

Figure 2:
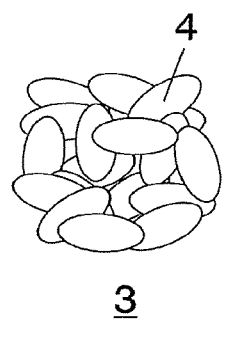
FIG. 2 is a schematic sectional view of a secondary particle (B).

A schematic cross-sectional view of the secondary particle (B) is shown in FIG. 2. As shown in FIG. 2, a secondary particle (B) 3 is formed of primary particles 4 of boron nitride, which have a small aspect ratio. Specifically, the secondary particle (B) 3 is formed of primary particles 4 of boron nitride which have an aspect ratio of 2 to 9, preferably of 2.3 to 8.5, and more preferably of 2.5 to 8. Primary particles 4 of boron nitride which have such an aspect ratio have excellent adhesiveness with the thermosetting resin because the ratio of an area of an edge-face having functional groups is large, and as the result thereof, can provide a thermal conductive sheet having excellent adhesiveness with other members. Therefore, the secondary particle (B) 3 mainly works as a component that improves the adhesiveness of the thermal conductive sheet. When the aspect ratio of the primary particle 4 of boron nitride is less than 2, the thermal conductivity decreases remarkably because the diameter in the c-axis direction (thickness direction) low in thermal conductivity becomes larger. On the other hand, when the aspect ratio of the primary particle 4 of boron nitride exceeds 9, the adhesiveness of the thermal conductive sheet cannot be improved because the ratio of the area of the end-face of the primary particle 4 of boron nitride becomes smaller.

Similar to the secondary particle (A) 1, the shape of the secondary particle (B) 3 is not particularly limited and can be spherical, as well as oblong, flaky, or the like. In particular, the secondary particle (B) 3 is preferably spherical because when the secondary particle (B) 3 is spherical, the blending amount of the secondary particles (B) can be increased while the fluidity of the thermosetting resin composition at the time of producing the thermosetting resin composition can be secured.

The average particle size of the secondary particles (B) 3 is not particularly limited but is preferably 1 μm to 150 μm, more preferably 3 μm to 120 μm, and most preferably 5 μm to 100 μm. When secondary particles (B) 3 having an average particle size in this range are used, the effect of the present invention can be acquired stably.

When the contents of the secondary particles (A) 1 and the secondary particles (B) 3 are increased in the thermosetting resin composition that contains the secondary particles (A) 1 and the secondary particles (B) 3 as the inorganic filler, defects such as voids or the like tend to occur in the thermal conductive sheet obtained from the thermosetting resin composition. Such defects in the thermal conductive sheet cause the degradation of characteristics such as thermal conductivity, adhesiveness and electrical insulating properties of the thermal conductive sheet.

However, defects in the thermal conductive sheet can be prevented by controlling the specific surface areas and the compressive strengths of the secondary particles (A) 1 and the secondary particles (B) 3 to predetermined ranges.

The specific surface area of the secondary particles (A) 1 is preferably 4 $m^2/g$ to 15 $m^2/g$, and more preferably 6 $m^2/g$ to 12 $m^2/g$. The specific surface area of the secondary particles (B) 3 is preferably less than 4 $m^2/g$ and more preferably 3 $m^2/g$ or less. When the specific surface areas are controlled to such ranges, it becomes difficult for defects in the thermal conductive sheet to occur even when the contents of the secondary particles (A) 1 and the secondary particles (B) 3 are increased.

When the specific surface area of the secondary particles (A) 1 exceeds 15 $m^2/g$, the amount of the thermosetting resin filled in the gaps of the secondary particles (A) 1 increases. As a result, when the contents of the secondary particles (A) 1 and the secondary particles (B) 3 are increased, the amount of the thermosetting resin becomes deficient and defects are likely to occur in the thermal conductive sheet. Further, since the binding between the primary particles 2 of boron nitride, which constitute the secondary particles (A) 1 decreases, the thermal conductivity of the secondary particles (A) 1 also decreases and a thermal conductive sheet having the desired thermal conductivity may not be obtained. On the other hand, when the specific surface area of the secondary particles (A) 1 is less than 4 $m^2/g$, the denseness of the secondary particles (A) 1 that mainly play the role of improving the thermal conductivity of the thermal conductive sheet decreases. As a result, the thermal conductivity of the secondary particles (A) 1 decreases, and a thermal conductive sheet having the desired thermal conductivity may not be obtained.

Further, when the specific surface area of the secondary particles (B) 3 exceeds 4 $m^2/g$, an amount of the thermosetting resin filled in the gaps of the secondary particles (B) 3 increases. As a result, when the contents of the secondary particles (A) 1 and the secondary particles (B) 3 are increased, the amount of thermosetting resin becomes deficient and defects are likely to occur in the thermal conductive sheet.

Here, in the present specification, the specific surface areas of the secondary particles (A) 1 and the secondary particles (B) 3 refer to values obtained by measuring by a BET three-point method using a gas absorption type specific surface area meter.

The compressive strength of the secondary particle (A) 1 is preferably 6 MPa or more, and the compressive strength of the secondary particle (B) 3 is preferably 3 MPa to 5 MPa. By controlling the compressive strength to such ranges, defects in the thermal conductive sheet are less likely to occur even when the contents of the secondary particles (A) 1 and the secondary particles (B) 3 are increased.

When the compressive strength of the secondary particle (A) 1 is less than 6 MPa, the rate at which the secondary particles (A) 1 that mainly play a role in improvement of the thermal conductivity of the thermal conductive sheet collapse during production of the thermal conductive sheet (for example, during the step of pressing) increases, and a thermal conductive sheet having the desired thermal conductivity may not be obtained.

Further, when the compressive strength of the secondary particle (B) 3 is less than 3 MPa, a thermal conductive sheet having the desired thermal conductivity and adhesiveness may not be obtained because the secondary particles (B) 3 tend to collapse due to shearing force during kneading in the kneading step when the thermosetting resin composition is prepared. On the other hand, when the compressive strength of the secondary particles (B) 3 exceeds 5 MPa, the secondary particles (B) 3 become too hard, and their role as a cushion material between the secondary particles (A) 1 may be impaired. As a result, a thermal conductive sheet having the desired thermal conductivity and adhesiveness may not be obtained or defects may occur in the thermal conductive sheet.

Here, in the present specification, the compressive strengths of the secondary particles (A) 1 and secondary particles (B) 3 mean values obtained according to the following method.

First, a thermal conductive sheet in which the secondary particles (A) 1 and the secondary particles (B) 3 are dispersed in the thermosetting resin is prepared. Subsequently, the thermal conductive sheet is calcified by heat-treating at a temperature from 500° C. to 800° C. for about 5 to 10 hours in an air atmosphere using an electric furnace. The secondary particles remaining after the calcification are divided into the secondary particles (A) 1 and secondary particles (B) 3 based on appearance configuration using a microscope. Then, the secondary particles (A) 1 and secondary particles (B) 3 are subjected to a compression test using a micro compression tester and an obtained stress-strain curve is used to calculate the compressive strength.

Average length of the primary particles 2 of boron nitride, which constitute the secondary particles (A) 1, and the primary particles 4 of boron nitride, which constitute the secondary particles (B) 3 are not particularly limited but are preferably 0.1 μm to 30 μm, more preferably 0.5 μm to 20 μm, and most preferably 1 μm to 15 μm. When the average length is in these ranges, the secondary particles (A) 1 and (B) 3 have isotropic thermal conductivity because the primary particles 2, 4 of boron nitride flocculate in all directions. As a result, the thermal conductivity of the thermal conductive sheet can be improved. When the average length of the primary particles 2, 4 of boron nitride exceeds 30 μm, a thermal conductive sheet having the desired thermal conductivity may not be obtained because the secondary particles (A) 1 and (B) 3 are difficult to form, the cohesive strength decreases, and the secondary particles (A) 1 and (B) 3 collapse during production of the thermal conductive sheet (for example, during the step of pressing). On the other hand, when the average length of the primary particles 2, 4 of boron nitride is less than 0.1 μm, a thermal conductive sheet having the desired thermal conductivity may not be obtained because the numbers of the primary particles 2, 4 of boron nitride per unit mass increase and the interfacial resistance becomes larger.

The ratio of the average particle size of the secondary particles (A) 1 to the average particle size of the secondary particles (B) 3, $(D_A/D_B)$, is not particularly limited but is preferably 0.8 to 10, more preferably 0.8 to 9, and most preferably 0.9 to 8. When the ratio of the average particle sizes $(D_A/D_B)$ is less than 0.8, a thermal conductive sheet having the desired thermal conductivity may not be obtained because the magnitude of the secondary particles (A) 1 that play a role in improvement of the thermal conductivity is too small and, as a result, transmission of heat decreases. On the other hand, when the ratio of the average particle sizes $(D_A/D_B)$ exceeds 10, a thermal conductive sheet having the desired thermal conductivity may not be obtained, because the magnitude of the secondary particles (B) 3 that play a role in improvement of the adhesiveness is too small.

The ratio of volumes of the secondary particles (A) 1 to the secondary particles (B) 3 in the thermosetting resin composition is not particularly limited but is preferably 5:95 to 90:10, more preferably 20:80 to 80:20, and most preferably 40:60 to 70:30. When the volume ratio of the secondary particles (A) 1 is smaller than the above range, a thermal conductive sheet having the desired thermal conductivity may not be obtained because the ratio of the secondary particles (A) 1 that play a role in improvement of the thermal conductivity is too small. On the other hand, when the volume ratio of the secondary particles (A) 1 is larger than the above range, a thermal conductive sheet having the desired adhesiveness may not be obtained because the ratio of the secondary particles (B) 3 that play a role in improvement of the adhesiveness is too small.

The secondary particles (A) 1 and (B) 3 can be produced in such a manner that a slurry that contains the primary particles 2, 4 of boron nitride, which have predetermined aspect ratios, is sintered after flocculating according to a well-known method such as a spray dry method or the like. Here, sintering temperature is not particularly limited but is generally about 2,000° C.

The inorganic filler that is used in the thermosetting resin composition contains the secondary particles (A) 1 and (B) 3 described above as essential components but can also contain other general inorganic powders in a range that does not inhibit the effect of the present invention. Such an inorganic powder is not particularly limited, but primary particles of boron nitride (BN), fused silica ($SiO_2$), crystalline silica ($SiO_2$), aluminum oxide ($Al_2O_3$), magnesium oxide (MgO), aluminum nitride (AlN), silicon carbide (SiC) and the like can be used. Further, the inorganic filler may contain secondary particles other than the secondary particles (A) 1 and (B) 3. For example, secondary particles in which primary particles of boron nitride have an aspect ratio larger than 20 can be contained.

The thermosetting resin composition can provide a thermal conductive sheet having excellent adhesiveness even when the content of the inorganic filler is increased because it contains, as the inorganic filler, the secondary particles (A) 1 that play a role in improvement of the thermal conductivity together with the secondary particles (B) 3 that play a role in improvement of the adhesiveness.

The content of the inorganic filler is not particularly limited but is 40% by volume to 80% by volume and preferably 45% by volume to 70% by volume in the solid content of the thermosetting resin composition. Here, in the present specification, the solid content of the thermosetting resin composition refers to components that remain in the thermal conductive sheet. For example, when the thermosetting resin composition contains a solvent that is explained below, solid content means components of the thermosetting resin composition excluding the solvent. When the content of the inorganic filler is less than 40% by volume, a thermal conductive sheet having the desired thermal conductivity may not be obtained. On the other hand, when the content of the inorganic filler exceeds 80% by volume, defects such as voids or the like are likely to occur in the thermal conductive sheet, and the thermal conductivity, adhesiveness and electric insulating properties of the thermal conductive sheet may be degraded.

The thermosetting resin used in the thermosetting resin composition is not particularly limited, and a resin that is well-known in the relevant technical field can be used. Examples of the thermosetting resin include epoxy resins, unsaturated polyester resins, phenolic resins, melamine resins, silicone resins, polyimide resins and the like. Among these, epoxy resins are preferable because they have excellent characteristics such as heat resistance and adhesiveness. Examples of epoxy resins include bisphenol A epoxy resins, bisphenol F epoxy resins, ortho-cresol novolak epoxy resins, phenol novolak epoxy resins, alicyclic epoxy resins, glycidyl aminophenol epoxy resins and so on. These resins can be used singularly or in a combination of two or more kinds thereof.

The thermosetting resin composition can further include a curing agent to cure the thermosetting resin. The curing agent is not particularly limited and may be appropriately selected in accordance with the kind of thermosetting resin. Examples of the curing agent include alicyclic acid anhydrides such as tetrahydomethylphthalic anhydride, hexahydromethylphthalic anhydride, himic anhydride and the like; aliphatic acid anhydrides such as dodecenylsuccinic anhydride and the like; aromatic acid anhydrides such as phthalic anhydride, trimellitic anhydride and the like; organic dihydrazides such as dicyandiamide, adipic dihydrazide and the like; polyphenol compounds such as bisphenol A, bisphenol F, bisphenol S, a phenol novolak resin, a cresol novolak resin, a p-hydroxystyrene resin and the like; tris(dimethylaminomethyl)phenol; dimethyl benzylamine; 1,8-diazabicyclo(5,4,0)undecene and derivatives thereof; and imidazoles such as 2-methylimidazole, 2-ethyl-4-methylimidazole, 2-phenylimidazole and the like. These curing agents can be used singularly or in a combination of two or more kinds thereof.

The blending amount of the curing agent must be determined appropriately depending on the kinds of thermosetting resin and curing agent that are used but is generally 0.1 parts by mass to 200 parts by mass, based on 100 parts by mass of the thermosetting resin.

The thermosetting resin composition can further include a coupling agent from the viewpoint of improving the adhesive force of the interface between the thermosetting resin and the inorganic filler. The coupling agent is not particularly limited and may be appropriately selected depending on the kinds of thermosetting resin and inorganic filler. Examples of such coupling agents include silane coupling agents such as γ-glycidoxypropyltrimethoxysilane, N-β(aminoethyl)γ-aminopropyltriethoxysilane, N-phenyl-γ-aminopropyltrimethoxysilane, γ-mercaptopropyltrimethoxysilane, and the like; titanate-based coupling agents such as alkoxy titanium ester, titanium chelate and the like; and aluminate-based coupling agents such as acetoalkoxy aluminum diisopropylate and the like. These can be used singularly or in combinations of two or more kinds thereof.

The blending amount of the coupling agent in the thermosetting resin composition may be appropriately set depending on the kinds and the like of the thermosetting resin and the coupling agent that are used and is generally 0.01 parts by mass to 10 parts by mass, based on 100 parts by mass of the thermosetting resin.

The thermosetting resin composition can further include a solvent from the viewpoint of adjusting the viscosity of the composition. The solvent is not particularly limited and may be appropriately selected depending on the kinds of thermosetting resin and inorganic filler. Examples of such a solvent include toluene, methyl ethyl ketone and the like. These can be used singularly or in combinations of two or more kinds thereof.

The blending amount of the solvent in the thermosetting resin composition is not particularly limited as long as it is a miscible amount and is generally 20 parts by mass to 200 parts by mass, based on 100 parts by mass of a total of the thermosetting resin and the inorganic filler.

A method of producing the thermosetting resin composition that contains constituent elements such as those described above is not particularly limited and can be carried out according to a known method. For example, the thermosetting resin composition can be produced as described below.

First, a predetermined amount of the thermosetting resin and the curing agent in an amount necessary to cure the thermosetting resin are mixed. Next, after the solvent is added to this mixture, the inorganic filler (specifically, the secondary particles (A)1 and (B)3) is added, and preliminary mixing is carried out. Further, when the viscosity of the thermosetting resin composition is low, the solvent need not be added. Next, the preliminary mixture is kneaded using a three-roller mixing machine, a kneader or the like to obtain the thermosetting resin composition. Further, when the coupling agent is blended in the thermosetting resin composition, the coupling agent should also be added before the kneading step.

The thermosetting resin composition produced as described above includes the secondary particles (A) 1 that play a role in improvement of the thermal conductivity and the secondary particles (B) 3 that play a role in improvement of the adhesiveness as the inorganic filler. Therefore, even when the content of the inorganic filler is increased, adhesiveness can be prevented from decreasing, and a thermal conductive sheet in which all of the thermal conductivity, the adhesiveness and the electric insulating properties are simultaneously improved can be provided.

Embodiment 2

A thermal conductive sheet of the present embodiment was obtained by curing the thermosetting resin composition described above while pressurizing under a predetermined pressing pressure.

Hereinafter, the thermal conductive sheet of the present embodiment will be described with reference to the drawings.

Figure 3:
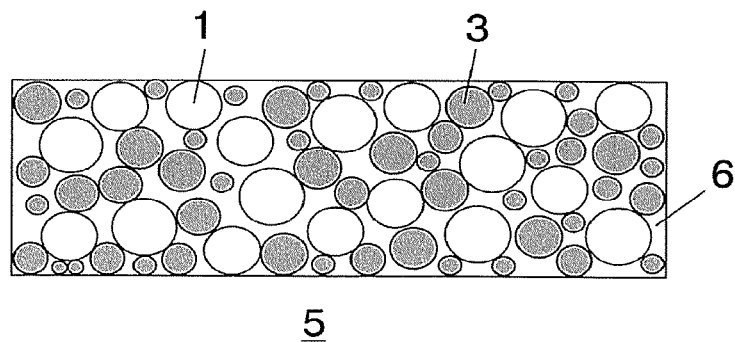
FIG. 3 is a schematic sectional view of a thermal conductive sheet.

FIG. 3 is a schematic sectional view of the thermal conductive sheet of the present embodiment. In FIG. 3, a thermal conductive sheet 5 is formed of a thermosetting resin 6 that is a matrix, and the secondary particles (A) 1 and secondary particles (B) 3, which are dispersed in the thermosetting resin.

The thermal conductive sheet 5 having such a configuration can improve the thermal conductivity in a direction of sheet thickness because the thermal conductive sheet 5 includes the secondary particles (A) 1 and secondary particles (B) 3 which have isotropic thermal conductivity. In particular, the secondary particles (A) 1 can further improve the thermal conductivity of the thermal conductive sheet 5 because the primary particles 2 of boron nitride have a large aspect ratio and can efficiently transmit heat. Further, the secondary particles (B) 3 have excellent adhesiveness with the thermosetting resin 6/ because the primary particles 4 of boron nitride have a small aspect ratio and a large ratio of an area of end-faces having functional groups. Therefore, adhesiveness to the thermosetting resin 6 is improved and as a result thereof, the adhesiveness of the thermal conductive sheet 5 can be improved.

By contrast, a thermal conductive sheet 5 obtained from a thermosetting resin composition that includes only the secondary particles (A) 1 in which the primary particles of boron nitride have a large aspect ratio is, while having excellent thermal conductivity, incapable of providing a thermal conductive sheet 5 having the desired adhesiveness because adhesiveness with the thermosetting resin 6 is low.

Further, a thermal conductive sheet 5 obtained from a thermosetting resin composition that includes only the secondary particles (B) 3 in which the primary particles 4 of boron nitride have a small aspect ratio is, while having excellent adhesiveness, incapable of providing a thermal conductive sheet 5 having the desired thermal conductivity because the thermal conductivity is low.

The thermal conductive sheet 5 of the present embodiment can be produced according to a method that includes a step of coating and drying the above thermosetting resin composition on a releasing base material; and a step of curing a coated and dried material while pressurizing under predetermined pressing pressure.

Here, the releasing base material is not particularly limited and known releasing base materials such as a release-treated resin sheet, film, and the like can be used.

The method of coating the thermosetting resin composition is not limited particularly and known methods such as a doctor blade method and the like can be used.

A coated thermosetting resin composition may be dried at an ambient air temperature but may be heated to 80° C. to 150° C. as required from the viewpoint of expediting volatilization of the solvent.

Pressing pressure during the step of pressurizing the coated and dried material is 0.5 MPa to 50 MPa, and preferably 1.9 MPa to 30 MPa. When the pressing pressure is less than 0.5 MPa, voids in the thermal conductive sheet 5 cannot be sufficiently removed. By contrast, when the pressing pressure exceeds 50 MPa, the secondary particles (A) 1 and the secondary particles (B) 3 deform or collapse, and the thermal conductivity and the electric insulating properties of the thermal conductive sheet 5 are decreased. Further, pressing time is not particularly limited but is generally 5 minutes to 300 minutes.

Curing temperature of the coated and dried material may be set appropriately corresponding to the kind of thermosetting resin to be used but is generally 80° C. to 250° C. Further, the curing time is not particularly limited but is generally 2 minutes to 24 hours.

The thermal conductive sheet 5 produced as described above has excellent adhesiveness. Therefore, when the thermal conductive sheet 5 is placed between a heat generation member and a heat dissipation member of an electrical/electronic apparatus, the heat generation member and the heat dissipation member are stably adhered and can be electrically insulated. Further, the thermal conductive sheet 5 of the present embodiment can also efficiently transmit heat from the heat generation member to the heat dissipation member because it has high thermal conductivity.

In a case where the thermal conductive sheet 5 is incorporated in an electrical/electronic apparatus, the thermal conductive sheet 5 can also be produced by directly coating the thermosetting resin composition on the heat generation member or the heat dissipation member. Further, the thermal conductive sheet 5 can also be produced in such a manner that the thermal conductive sheet 5 in which a thermosetting resin 6 of a matrix is in a B stage state is produced in advance, and the thermal conductive sheet 5 is, after being placed between the heat generation member and the heat dissipation member, heated at 80° C. to 250° C. while being pressurized under a predetermined pressing pressure. According to these methods, the adhesiveness of the heat generation member and the heat dissipation member to the thermal conductive sheet 5 can be further improved.

Embodiment 3

A power module of the present embodiment includes a power semiconductor element mounted on one heat dissipation member, another heat dissipation member that externally dissipates heat generated by the power semiconductor element and the above thermal conductive sheet that transmits the heat generated by the semiconductor element from the one heat dissipation member to the other heat dissipation member.

Hereinafter, the power module of the present embodiment will be described with reference to the drawings.

Figure 4:
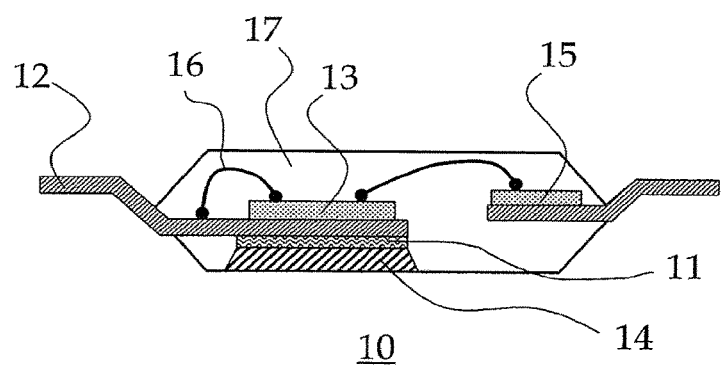
FIG. 4 is a schematic sectional view of a power module.
Figure 5:
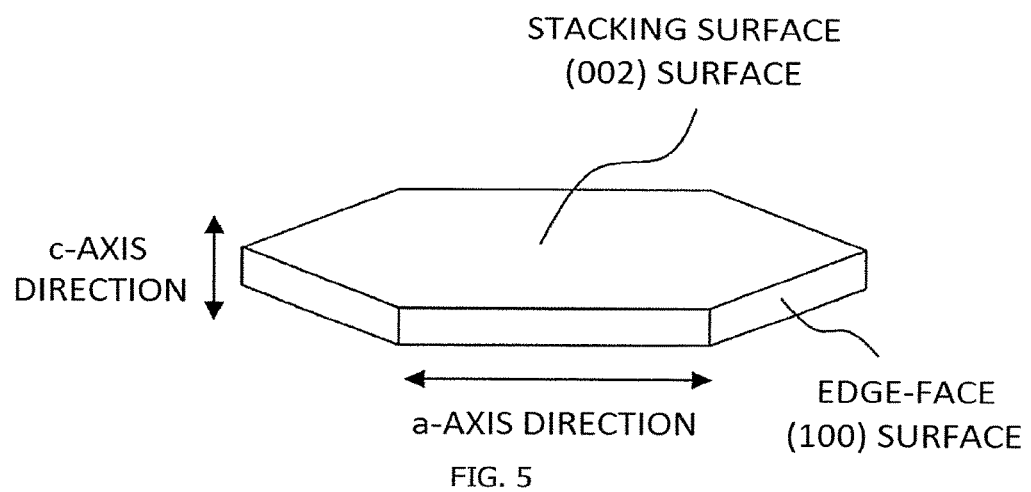
FIG. 5 is a crystal structure of boron nitride.
Figure 6:
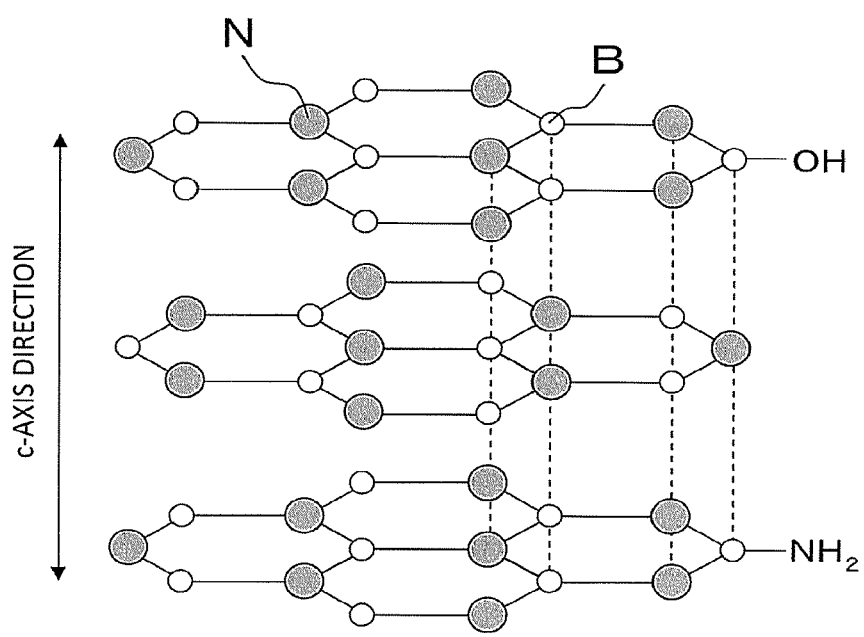
FIG. 6 is a molecular structure of boron nitride.

FIG. 4 is a schematic cross-sectional view of the power module of the present embodiment. In FIG. 4, a power module 10 includes a lead frame 12 that is one heat dissipation member, a heat sink 14 that is the other heat dissipation member, a thermal conductive sheet 11 disposed between the lead frame 12 and the heat sink 14, a power semiconductor element 13 mounted on the lead frame 12 and a control semiconductor element 15. Then, a portion between the power semiconductor element 13 and the control semiconductor element 15, and a portion between the power semiconductor element 13 and the lead frame 12 are wire-bonded with a metal wire 16. Further, portions other than the external connection portion of the lead frame 12 and the external heat dissipation portion of the heat sink 14 are sealed with a sealing resin 17.

In this power module 10, members other than the thermal conductive sheet 11 are not particularly limited and well-known members in the relevant technical field can be used. For example, as the power semiconductor element 13, although one made of silicon can be used, a member made of a wide band gap semiconductor having a band gap larger than that of silicon is preferably used. As the wide band gap semiconductor, silicon carbide, gallium nitride-based materials or diamond, for example, can be used.

The power semiconductor element 13 formed from the wide band gap semiconductor can miniaturize the power semiconductor element 13 because the voltage endurance is high and the allowable current density is also high. When such a miniaturized power semiconductor element 13 is used, the power module 10 in which the power semiconductor element 13 is incorporated can also be miniaturized.

Further, the power semiconductor element 13 formed of the wide band gap semiconductor can further miniaturize the power module 10 because, since the heat resistance is also high, the lead frame 12, the heat dissipation members such as the heat sink 14 and so on can also be miniaturized.

Further, the power semiconductor element 13 formed of the wide band gap semiconductor can also be made highly efficient as an element because power loss is also low.

The method of incorporating the thermal conductive sheet 11 into the power module 10 is not particularly limited and a known method can be used. For example, in a case where the thermal conductive sheet 11 is separately produced, after inserting the thermal conductive sheet 11 between the lead frame 12 on which various kinds of components such as the power semiconductor element 13 are mounted and the heat sink 14, this is arranged in a transfer mold die, and a transfer mold apparatus may be used to flow the sealing resin 17 into the die and to seal by pressurizing and by heating.

Further, in a case where the thermal conductive sheet 11 is directly formed on the heat sink 14, after placing the lead frame 12 on which various kinds of components such as the power semiconductor element 13 are mounted on the thermal conductive sheet 11, this is arranged in the transfer mold die, and the transfer mold apparatus may be used to flow the sealing resin 17 into the die and to seal by pressurizing and heating.

Further, in the above description, although a sealing method according to the transfer mold method was described, known methods other than the above (for example, a press molding method, an injection molding method, and an extrusion molding method) and the like may be used.

In particular, in a case where the thermal conductive sheet 11 is incorporated into the power module 10, it is preferable to prepare the thermal conductive sheet 11 in such a manner that the thermal conductive sheet 11 in which the thermosetting resin is in a B stage state (semi-cured state) is produced in advance, and then insert this between the lead frame 12 and the heat sink 14, followed by heating to 150° C. to 250° C. while pressurizing under a predetermined pressing pressure. According to this method, the adhesiveness of the lead frame 12 and the heat sink 14 to the thermal conductive sheet 11 can be increased.

The thus produced power module 10 of the present embodiment has high heat dissipation properties and electric insulating properties because the power module 10 has the thermal conductive sheet having excellent thermal conductivity, adhesiveness and electrical insulating properties.

EXAMPLES

Hereinafter, the present invention will be described in detail with reference to examples and comparative examples. However, the present invention is not limited to these examples.

Secondary particles used in the following examples and comparative examples were produced in such a manner that a slurry containing primary particles of boron nitride was, after flocculating according to a known method such as a spray dry method or the like, sintered at about 2,000° C. Features of various secondary particles prepared by varying raw materials, producing conditions, and so on are shown in Table 1. Incidentally, the average length and aspect ratios of the primary particles and specific surface areas, compressive strengths and average particle sizes of the secondary particles were obtained according to the above-described methods.

TABLE 1

| | | Primary particles | | Secondary particles | | |
|---|---|---|---|---|---|---|
| | No. | Aspect ratio | Average length (μm) | Specific surface area (m²/g) | Compressive strength (MPa) | Average particle size (μm) |
| Secondary particles (A) | A | 10.5 | 5 | 13.2 | 8.3 | 110 |
| | B | 11.8 | 7 | 10.2 | 6.9 | 83 |
| | C | 15.3 | 12 | 7.1 | 6.1 | 72 |
| Secondary particles (B) | D | 2.7 | 4 | 1.4 | 4.1 | 55 |
| | E | 4.5 | 8 | 1.78 | 3.5 | 38 |
| | F | 7.5 | 3 | 2.6 | 4.6 | 8 |
| Secondary particles (other) | G | 25.4 | 10 | 5.6 | 2.5 | 80 |
| | H | 1.3 | 2 | 22 | 6.3 | 35 |

Example 1

After 100 parts by mass of a liquid bisphenol A type epoxy resin (thermosetting resin, Epicoat 828 manufactured by Japan Epoxy Resins) and 1 part by mass of 1-cyanoethyl-2-methylimidazole (curing agent, Curezol 2PN-CN manufactured by Shikoku Chemicals Corporation) were mixed, 166 parts by mass of methyl ethyl ketone (solvent) were further added, followed by mixing and stirring. Next, to this mixture, an inorganic filler obtained by mixing secondary particles No. A and secondary particles No. D at a volume ratio of 60:40 was added such that the content of the inorganic filler in a solid content (total components excluding the solvent) was 60% by volume, followed by preliminarily mixing. Next, this preliminary mixture was kneaded by a three-rollers mixing machine and a thermosetting resin composition in which the secondary particles No. A and secondary particles No. B were uniformly dispersed was prepared.

Next, the thermosetting resin composition was coated on a copper foil (heat dissipation member) having a thickness of 105 μm with to a doctor blade method and dried at 110° C. for 15 minutes to obtain a thermal conductive sheet having a thickness of 100 μm and in a B stage state.

Then, two of the thermal conductive sheets formed on the copper foil and in a B stage state were superposed such that the thermal conductive sheet sides were on the inside, followed by heating at 120° C. for 1 hour while pressurizing under a pressing pressure of 10 to 20 MPa, further followed by heating at 160° C. for 3 hours to completely cure the thermosetting resin that is a matrix of the thermal conductive sheet. A thermal conductive sheet sandwiched between two copper foils was obtained.

Example 2

A thermal conductive sheet was obtained in the same manner as example 1, except that the secondary particles No. E were used in place of the secondary particles No. D.

Example 3

A thermal conductive sheet was obtained in the same manner as example 1, except that a mixture of the secondary particles No. C and secondary particles No. F (volume ratio of 60:40) was used as the inorganic filler.

Example 4

A thermal conductive sheet was obtained in the same manner as example 1, except that a mixture of the secondary particles No. B and secondary particles No. D (volume ratio of 60:40) was used as the inorganic filler.

Example 5

A thermal conductive sheet was obtained in the same manner as example 1, except that the secondary particles No. C were used in place of the secondary particles No. A.

Example 6

A thermal conductive sheet was obtained in the same manner as example 1, except that a mixture of the secondary particles No. A and the secondary particles No. D (volume ratio of 40:60) was used as the inorganic filler.

Example 7

A thermal conductive sheet was obtained in the same manner as example 1, except that a mixture of the secondary particles No. A and the secondary particles No. D (volume ratio of 85:15) was used as the inorganic filler.

Example 8

A thermal conductive sheet was obtained in the same manner as example 1, except that the inorganic filler was added such that the content of the inorganic filler in the solid content (total components excluding the solvent) was 45% by volume and an addition amount of methyl ethyl ketone was changed to 125 parts by mass.

Example 9

A thermal conductive sheet was obtained in the same manner as example 1, except that the inorganic filler was added such that the content of the inorganic filler in the solid content (total components excluding the solvent) was 75% by volume and the addition amount of methyl ethyl ketone was changed to 208 parts by mass.

Comparative Example 1

A thermal conductive sheet was obtained in the same manner as example 1, except that primary particles of boron nitride (average length: 8 μm, aspect ratio: 11.4) were used as the inorganic filler.

Comparative Example 2

A thermal conductive sheet was obtained in the same manner as example 1, except that only the secondary particles No. A were used as the inorganic filler.

Comparative Example 3

A thermal conductive sheet was obtained in the same manner as example 1, except that only the secondary particles No. D were used as the inorganic filler.

Comparative Example 4

A thermal conductive sheet was obtained in the same manner as example 1, except that the secondary particles No. G were used in place of the secondary particles No. A.

Comparative Example 5

A thermal conductive sheet was obtained in the same manner as example 1, except that the secondary particles No. H were used in place of the secondary particles No. D.

Thermal conductivities in a sheet thickness direction of the thermal conductive sheets obtained in the examples and comparative examples were measured by a laser flash method. Measurement results of the thermal conductivity are shown in Table 2 as a relative value of the thermal conductivity obtained in each of the examples or comparative examples with the thermal conductivity obtained in the thermal conductive sheet of comparative example 1 set as a reference (a value of [thermal conductivity obtained in the thermal conductive sheet of each of the examples or comparative examples]/[thermal conductivity obtained in the thermal conductive sheet of comparative example 1]).

Further, the adhesion strength of the thermal conductive sheet was measured according to a tensile test based on JIS C6481. The measurement results of the adhesion strength are shown in Table 2 as a relative value of the adhesion strength obtained in the thermal conductive sheet of each of the examples or comparative examples with the adhesion strength obtained in the thermal conductive sheet of comparative example 1 set as a reference ([adhesion strength obtained in the thermal conductive sheet of each of the examples or comparative examples]/[adhesion strength obtained in the thermal conductive sheet of comparative example 1]).

Further, the denseness that indicates void content in the thermal conductive sheet was calculated by the following formula (1) by measuring the specific gravity according to an Archimedes method after peeling off the copper foil (heat dissipation member) disposed on both surfaces of the thermal conductive sheet. Results thereof are shown in Table 2.

Denseness=(measured specific gravity of the thermal conductive sheet/theoretical specific gravity of the thermal conductive sheet)×100　　　(1)

Further, in Table 2, the kinds and blending amounts of constituent components used in each example and each comparative example are also summarized. Further, the respective blending amounts are expressed by parts by mass.

TABLE 2

| | | | Examples | | | | | | |
|---|---|---|---|---|---|---|---|---|---|
| | | | 1 | 2 | 3 | 4 | 5 | 6 | 7 |
| | Thermosetting resin | | 100 | 100 | 100 | 100 | 100 | 100 | 100 |
| | Curing agent | | 1 | 1 | 1 | 1 | 1 | 1 | 1 |
| | Solvent | | 166 | 166 | 166 | 166 | 166 | 166 | 166 |
| Inorganic filler | Secondary particles (A) | A | 172 | 172 | — | — | — | 115 | 244 |
| | | B | — | — | — | 172 | — | — | — |
| | | C | — | — | 172 | — | 172 | — | — |
| | Secondary particles (B) | D | 115 | — | — | 115 | 115 | 172 | 43 |
| | | E | — | 115 | — | — | — | — | — |
| | | F | — | — | 115 | — | — | — | — |
| | Secondary particles (other) | G | — | — | — | — | — | — | — |
| | | H | — | — | — | — | — | — | — |
| | Primary particles of boron nitride | | — | — | — | — | — | — | — |
| | Volume ratio of secondary particles (A) and secondary particles (B) | | 60:40 | 60:40 | 60:40 | 60:40 | 60:40 | 40:60 | 85:15 |
| | Ratio of average particle size of secondary particles (A) to secondary particles (B) | | 2.0 | 2.9 | 9.0 | 1.5 | 1.3 | 2.0 | 2.0 |
| | Content of inorganic filler (volume %) | | 60 | 60 | 60 | 60 | 60 | 60 | 60 |
| | Denseness (%) | | 99 | 100 | 99 | 98 | 99 | 100 | 99 |
| | Relative value of thermal conductivity | | 1.6 | 1.75 | 1.65 | 1.73 | 1.78 | 1.53 | 1.83 |
| | Relative value of adhesive strength | | 2.56 | 2.35 | 2.23 | 2.43 | 2.35 | 2.73 | 2.27 |

TABLE 2-continued

|  |  |  | Examples | | Comparative Examples | | | | |
|---|---|---|---|---|---|---|---|---|---|
|  |  |  | 8 | 9 | 1 | 2 | 3 | 4 | 5 |
| Thermosetting resin | | | 100 | 100 | 100 | 100 | 100 | 100 | 100 |
| Curing agent | | | 1 | 1 | 1 | 1 | 1 | 1 | 1 |
| Solvent | | | 125 | 208 | 166 | 166 | 166 | 166 | 166 |
| Inorganic filler | Secondary particles (A) | A | 129 | 215 | — | 287 | — | — | 172 |
| | | B | — | — | — | — | — | — | — |
| | | C | — | — | — | — | — | — | — |
| | Secondary particles (B) | D | 86 | 144 | — | — | 287 | 115 | — |
| | | E | — | — | — | — | — | — | — |
| | | F | — | — | — | — | — | — | — |
| | Secondary particles (other) | G | — | — | — | — | — | 172 | — |
| | | H | — | — | — | — | — | — | 115 |
| | Primary particles of boron nitride | | — | — | 287 | — | — | — | — |
| Volume ratio of secondary particles (A) and secondary particles (B) | | | 60:40 | 60:40 | — | 100:0 | 0:100 | — | — |
| Ratio of average particle size of secondary particles (A) to secondary particles (B) | | | 2.0 | 2.0 | — | — | — | — | — |
| Content of inorganic filler (volume %) | | | 45 | 75 | 60 | 60 | 60 | 60 | 60 |
| Denseness (%) | | | 100 | 100 | 100 | 99 | 98 | 98 | 99 |
| Relative value of thermal conductivity | | | 1.43 | 1.85 | 1.00 | 1.83 | 0.99 | 0.93 | 0.85 |
| Relative value of adhesive strength | | | 3.03 | 2.15 | 1.00 | 0.95 | 2.65 | 1.96 | 2.22 |

As shown in Table 2, the thermal conductive sheets of examples 1 to 9, which were produced with the thermosetting resin compositions that contain both the secondary particles (A) and (B) as the inorganic filler had high thermal conductivity and adhesion strength.

On the other hand, the thermal conductive sheet of comparative example 2, which was produced with the thermosetting resin composition that contains only the secondary particles (A) as the inorganic filler, was not satisfactory because, although the thermal conductivity was high, the adhesion strength was comparable with that of a reference thermal conductive sheet (the thermal conductive sheet of comparative example 1 produced with the thermosetting resin composition that contains the primary particles of boron nitride as the inorganic filler).

Further, the thermal conductive sheet of comparative example 3, which was produced with the thermosetting resin composition that contains only the secondary particles (B) as the inorganic filler, was not satisfactory because, although the adhesion strength was high, the thermal conductivity was comparable with that of the reference thermal conductive sheet.

Further, the thermal conductive sheet produced with the thermosetting resin composition that contains the secondary particles No. G that are formed of the primary particles having a large aspect ratio in place of the secondary particles (A) (comparative example 4), and also the thermal conductive sheet produced with the thermosetting resin composition that contains the secondary particles No. H that are formed of the primary particles having a small aspect ratio in place of the secondary particles (B) (comparative example 5) were not satisfactory because, although the adhesion strengths were high, the thermal conductivities were smaller than that of the reference thermal conductive sheet.

Example 10

Power modules were prepared by sealing the thermal conductive sheets produced in examples 1 to 9 with a sealing resin by a transfer mold method.

In the power module, after attaching thermocouples at center portions of the lead frame and the copper heat sink, the power module was operated, and temperatures of the lead frame and the heat sink were measured respectively. As a result thereof, all power modules that used the thermal conductive sheets of examples 1 to 9 had a small temperature difference between the lead frame and the heat sink; that is, had excellent heat dissipation properties.

As obvious from the above results, according to the present invention, a thermosetting resin composition that results in a thermal conductive sheet that has excellent filling property of the inorganic filler, and excellent thermal conductivity, adhesiveness and electrical insulating properties can be provided. Further, according to the present invention, a method of producing the thermal conductive sheet that has excellent filling property of the inorganic filler, and excellent thermal conductivity, adhesiveness and electrical insulating properties can be provided. Further, according to the present invention, a power module having excellent heat dissipation properties and electrical insulating properties can be provided.

The invention claimed is:

1. A thermosetting resin composition, containing
a thermosetting resin and
an inorganic filler,
wherein
the inorganic filler contains
secondary sintered particles (A), which are isotropic aggregates of primary particles of boron nitride which have an aspect ratio of 10 to 20, and
secondary sintered particles (B), which are isotropic aggregates of primary particles of boron nitride which have an aspect ratio of 2 to 9;
a specific surface area of the secondary sintered particles (A) is 4 $m^2/g$ to 15 $m^2/g$; and
a specific surface area of the secondary sintered particles (B) is less than 4 $m^2/g$.

2. A thermosetting resin composition, containing
a thermosetting resin and
an inorganic filler, wherein
the inorganic filler contains
- secondary sintered particles (A), which are isotropic aggregates of primary particles of boron nitride which have an aspect ratio of 10 to 20, and
- secondary sintered particles (B), which are isotropic aggregates of primary particles of boron nitride which have an aspect ratio of 2 to 9;

a compressive strength of the secondary sintered particles (A) is 6 MPa or more; and a compressive strength of the secondary sintered particles (B) is 3 MPa to 5 MPa.

3. The thermosetting resin composition according to claim 1, wherein a ratio of an average particle size of the secondary sintered particles (A) to that of the secondary sintered particles (B) is 0.8 to 10.

4. A thermosetting resin composition, containing
a thermosetting resin and
an inorganic filler,
wherein
the inorganic filler contains
- secondary sintered particles (A), which are isotropic aggregates of primary particles of boron nitride which have an aspect ratio of 10 to 20, and
- secondary sintered particles (B), which are isotropic aggregates of primary particles of boron nitride which have an aspect ratio of 2 to 9; and an average particle size of the secondary sintered particles (A) is 20 µm to 110 µm.

5. The thermosetting resin composition according to claim 1, wherein an average length of the primary particles of boron nitride, which form the secondary sintered particles (A) and the secondary sintered particles (B), is 0.1 µm to 30 µm.

6. The thermosetting resin composition according to claim 1, wherein a volume ratio of the secondary sintered particles (A) to the secondary sintered particles (B) is 5:95 to 90:10.

7. The thermosetting resin composition according to claim 1, wherein a content of the inorganic filler in a solid content of the thermosetting resin composition is 40% by volume to 80% by volume.

8. A method of producing a thermal conductive sheet, the method comprising
- coating and drying the thermosetting resin composition according to claim 1 on a mold-releasing base material to obtain a coated and dried material, and
- curing the coated and dried material while pressurizing under a pressing pressure of 0.5 MPa to 50 MPa.

9. A power module, comprising
a power semiconductor element mounted on a first heat dissipation member,
a second heat dissipation member that externally dissipates heat generated by the power semiconductor element, and
the thermal conductive sheet that transmits the heat generated by the power semiconductor element from the first heat dissipation member to the second heat dissipation member and is produced according to the method according to claim 8.

10. The power module according to claim 9, wherein the power semiconductor element is formed of a wide band gap semiconductor.

11. The power module according to claim 10, wherein the wide band gap semiconductor is silicon carbide, a gallium nitride-based material or diamond.

* * * * *